US009455494B2

(12) United States Patent
Lee

(10) Patent No.: US 9,455,494 B2
(45) Date of Patent: Sep. 27, 2016

(54) IN-VEHICLE MULTIMEDIA DEVICE HAVING ANTENNA MODULE AND TUNER PART MODULE INTEGRATED THEREIN

(71) Applicant: KWANG SUNG ELECTRONICS KOREA CO., LTD., Gunpo-si, Gyeonggi-do (KR)

(72) Inventor: Kyu Young Lee, Seoul (KR)

(73) Assignee: KWANG SUNG ELECTRONICS KOREA CO., LTD., Gunpo-Si, Gyeonggi-Do (KR)

(*) Notice: Subject to any disclaimer, the term of this patent is extended or adjusted under 35 U.S.C. 154(b) by 15 days.

(21) Appl. No.: 14/435,863

(22) PCT Filed: Oct. 1, 2013

(86) PCT No.: PCT/KR2013/008701
§ 371 (c)(1),
(2) Date: Apr. 15, 2015

(87) PCT Pub. No.: WO2014/061927
PCT Pub. Date: Apr. 24, 2014

(65) Prior Publication Data
US 2015/0270603 A1    Sep. 24, 2015

(30) Foreign Application Priority Data

Oct. 16, 2012    (KR) .................. 10-2012-0114847

(51) Int. Cl.
*H01Q 1/32*    (2006.01)
*H01Q 1/12*    (2006.01)
*H01R 12/00*    (2006.01)
*H01Q 23/00*    (2006.01)
*H04B 1/18*    (2006.01)
*H04B 1/3822*    (2015.01)

(52) U.S. Cl.
CPC .......... *H01Q 1/3275* (2013.01); *H01Q 1/1214* (2013.01); *H01Q 23/00* (2013.01); *H01R 9/096* (2013.01); *H04B 1/18* (2013.01); *H04B 1/3822* (2013.01)

(58) Field of Classification Search
CPC ...... H01Q 1/3275; H01Q 23/00; H01B 1/18; H01R 9/096
USPC .................................... 343/711, 713
See application file for complete search history.

(56) References Cited

U.S. PATENT DOCUMENTS

| | | | |
|---|---|---|---|
| 2003/0067182 A1* | 4/2003 | Rochford | H01Q 1/1214 296/180 |
| 2004/0266344 A1* | 12/2004 | Zafar | H01Q 1/08 455/13.3 |
| 2009/0207084 A1* | 8/2009 | Ikeda | H01Q 1/1207 343/713 |
| 2009/0303142 A1* | 12/2009 | Lerchner | H01Q 1/3275 343/713 |
| 2011/0237122 A1 | 9/2011 | Schwarz | |
| 2011/0279337 A1* | 11/2011 | Corwin | H01Q 1/088 343/713 |

FOREIGN PATENT DOCUMENTS

| | | |
|---|---|---|
| JP | 2009-537069 A | 10/2009 |
| KR | 10-2008-0045024 A | 5/2008 |
| KR | 10-2010-0041255 A | 4/2010 |
| KR | 2010-0041255 A | 4/2010 |
| KR | 10-2010-0137883 A | 12/2010 |
| KR | 10-2011-0127541 A | 11/2011 |

OTHER PUBLICATIONS

Search Report for International Application No. PCT/KR2013/008701.
European Search Report in connection with the European Application No. 138477732.

\* cited by examiner

*Primary Examiner* — Dieu H Duong
(74) *Attorney, Agent, or Firm* — LRK Patent Law Firm

(57) ABSTRACT

An in-vehicle multimedia device includes: an antenna module which has an antenna body arranged on the outer side surface of the roof of a vehicle, a first circuit substrate coupled to the antenna body, a connector part provided with through-holes therein formed to project downward from the lower surface of the antenna body, and first connection pins accommodated in the respective through-holes of the connector part and electrically connected with the first circuit substrate, a tuner part module which has a tuner part body arranged on the inner side surface of the roof of the vehicle, a second circuit substrate coupled to the tuner part body, and second connection pins provided in a coupling groove such that the connector part is inserted and coupled; and a coupling member that couples the antenna module and the tuner part module to each other.

6 Claims, 4 Drawing Sheets

IN-VEHICLE MULTIMEDIA DEVICE HAVING ANTENNA MODULE AND TUNER PART MODULE INTEGRATED THEREIN

TECHNICAL FIELD

The present invention relates to a multimedia device for a vehicle and, more particularly, to a multimedia device for a vehicle, which is capable of reducing a cost according to the configuration of a multimedia system because a plurality of expensive coaxial cables and connectors for connecting an antenna module installed on the outside of the roof of a vehicle and a tuner unit module installed inside the vehicle are not required, improving workability because two modules can be simply assembled without a separate cable task, and reducing a loss of the transfer of signals because accurate impedance can be maintained between the two modules assembled together by assembling the antenna module and the tuner unit module into a single integrated module using a coaxial connector structure.

BACKGROUND ART

In general, a multimedia system for a vehicle is a system for providing services, such as a car audio service, a moving image service, an analog broadcasting service, a digital broadcasting service, a telematics service, a communication service, and other services, within the vehicle. Such a multimedia system for a vehicle may be implemented in various forms, such as a car audio system.

FIG. 1 is a diagram schematically illustrating the location where an antenna module and a tuner unit module are conventionally installed in a vehicle, and FIG. 2 is a diagram schematically illustrating a conventional configuration in which the antenna module and the tuner unit module are coupled through coaxial cables (refer to Korean Patent Application Publication No. 2011-0127541).

Referring to FIGS. 1 and 2, the conventional multimedia system for a vehicle has a structure in which an antenna module 20 for sending and receiving radio signals (broadcasting and communication signals, etc.) is installed on the external surface of the vehicle 10 on the back side of a roof panel 12 and a tuner unit module 30 for processing a signal received by the antenna module 20 is embedded in a car audio installed on the instrument panel side of the vehicle and coupled through a plurality of coaxial cables 40. Furthermore, a low noise amplifier (LNA) for improving the reception sensitivity of an antenna is built in the antenna module 20, and a power line for supplying corresponding separate power is installed in the antenna module 20.

However, the conventional multimedia system for a vehicle having the aforementioned configuration is problematic in that a radio signal is deteriorated because the tuner unit module 30 is configured to be connected to the antenna module 20 mounted on the external surface of the roof panel 12 of the vehicle through the plurality of coaxial cables 40 at a remote distance. That is, a cable loss and a matching loss are generated because the coaxial cable 40 having a length of about 5 meters is used in order for a radio signal received through the antenna module 20 to be transferred to the tuner unit module 30 built in a car audio device. Furthermore, there is a problem in that the reception sensitivity of a broadcasting signal is significantly reduced because the tuner unit module 30 mounted on the car audio device is influenced by the wiring harness noise of a frequency band similar to a broadcasting frequency generated from a vehicle engine or driving motor because the engine room of the vehicle and the car audio device are closely disposed.

Furthermore, the conventional multimedia system for a vehicle is problematic in that an installation cost is high when constructing a multimedia system because a plurality of the expensive and long coaxial cables 40 and connectors (not illustrated) are used to couple the antenna module 20 and the tuner unit module 30, that workability according to a system construction is deteriorated because a complicated cable task for coupling modules is required, and that the fuel mileage of the vehicle is reduced because the weight of the vehicle is increased due to the installation of the plurality of coaxial cables.

DISCLOSURE

Technical Problem

The present invention has been made keeping in mind the above problems occurring in the prior art, and an object of the present invention is to provide a multimedia device for a vehicle, which is capable of reducing a cost according to the construction of a multimedia system, improving workability according to a system construction, and reducing a loss according to the transfer of a signal by configuring a tuner unit module conventionally built in the car audio device of a vehicle and an antenna module installed outside the roof of the vehicle so that the tuner unit module is disposed close to the antenna module and connected to a car audio through a single communication line and of a loss according to the transfer of a signal by configuring the antenna module and the tuner unit module so that accurate impedance is maintained between the antenna module and the tuner unit module.

Technical Solution

A multimedia device for a vehicle according to the present invention for solving the object includes an antenna module, including an antenna body disposed on the external side of the roof of the vehicle, a first circuit board coupled to the antenna body, a connector unit downward protruded from the bottom of the antenna body so that the connector unit penetrates a surface of a vehicle body and equipped with a plurality of through holes penetrated up and down, and a plurality of first connection pins received in the respective through holes of the connector unit and electrically connected to the first circuit board; a tuner unit module, including a tuner unit body disposed inside the roof of the vehicle, a second circuit board coupled to the tuner unit body, and a coupling groove into which the connector unit is inserted and coupled, wherein a plurality of second connection pins electrically connected to the second circuit board and engaged with the first connection pins within the through holes is provided within the coupling groove; a coupling member coupling the antenna module and the tuner unit module; and first dielectric bodies and second dielectric bodies inserted into the through holes of the connector unit and respectively surrounding the first connection pins and the second connection pins.

In this case, a coupling hole to which the coupling member is coupled is formed at the central part of the connector unit. The coupling member may penetrate the tuner unit module from bottom to top under the tuner unit module, and may be fastened and assembled with the coupling hole of the connector unit.

Furthermore, the plurality of through holes formed in the connector unit may be arranged to form a circular form or another form around the coupling hole.

Furthermore, first dielectric bodies and second dielectric bodies that are inserted into the through holes of the connector unit and that respectively surround and protect the first connection pins and the second connection pins may be further included.

Furthermore, in the antenna module, guide grooves may be formed in an outer circumferential surface of the connector unit, and guide protrusions engaged and coupled with the guide grooves may be formed in an inner circumferential surface of the coupling groove.

In this case, stopper protrusions closely attached to insides of the guide grooves may be additionally formed in the guide protrusions.

Furthermore, an insulation cover for insulation with the roof may be further installed in the tuner unit module.

Advantageous Effects

In accordance with embodiments of the present invention, the tuner unit module installed in the car audio device of a vehicle is disposed under the antenna module installed on the external surface of the roof of the vehicle so that the tuner unit module and the antenna module are configured to be coupled through a single communication connector structure. Accordingly, an installation cost according to the construction of a multimedia system can be significantly reduced because a plurality of expensive coaxial cables and connectors for coupling the antenna module and the tuner unit module as in the prior art are not required, and task convenience according to a system construction can be improved because a separate cable task for coupling the modules is not required.

Furthermore, communication with the tuner unit module on the lower side and an assembly task are simultaneously performed through the RF connector unit formed on the lower side of the both of the antenna module. Accordingly, reception sensitivity can be improved because accurate impedance is maintained between the antenna module and the tuner unit module and thus a loss of the transfer of signals between the two modules is reduced. Furthermore, workability can be improved because an assembly task between the two modules is simply performed.

Furthermore, the plurality of guide grooves is formed in the outer circumferential surface of the connector unit of the antennal module, and the plurality of guide protrusions engaged with the guide grooves is formed in the inner circumferential surface of the coupling grooves of the tuner unit module that are coupled with the guide grooves. Accordingly, there are advantages in that the antenna module and the tuner unit module can always be assembled at accurate locations because the guide grooves and the guide protrusions are coupled in a convex and concave form when the two modules are assembled and there is no fluctuation between the two modules after the assembly.

Furthermore, the stopper protrusions are additionally formed in the guide protrusions formed in the inner circumferential surface of the coupling grooves of the tuner unit module. Accordingly, there is an advantage in that a screw fastening task can be easily performed because the stopper protrusions can maintain temporary coupling force while being pressed on the inner surface of the guide grooves of the connector unit when the antenna module and the tuner unit module are assembled.

Furthermore, the insulation cover is mounted on top of the tuner unit module. Accordingly, a reduction in operation performance of the tuner unit module attributable to external heat transferred to the tuner unit module through the roof of a vehicle can be prevented because the external heat can be effectively blocked through the insulation cover.

Furthermore, there are advantages in that interference from an external signal can be prevented and the external emission of a signal can be effectively blocked because the entire tuner unit module formed of a conductor can function to shield a communication signal.

Furthermore, there is an advantage in that a user can freely set required impedance between the two modules by properly controlling a ratio of the diameters of the plurality of connection pins, that is, communication lines provided inside the connector unit of the antenna module, and the dielectric bodies that surround the connection pins.

DESCRIPTION OF REFERENCE NUMERALS

| | |
|---|---|
| 100: antenna module | 110: antenna body |
| 112: connector unit | 113: through hole |
| 114: coupling hole | 115: guide groove |
| 120: first circuit board | 130: first connection pin |
| 132: first dielectric body | 140: lower cover |
| 150: upper cover | 200: tuner unit module |
| 210: tuner unit body | 212: coupling groove |
| 214: guide protrusion | 215: stopper protrusion |
| 220: second circuit board | 230: second connection pin |
| 240: lower plate | 250: insulation cover |
| 270: screw | 300: multimedia device |

Mode for Invention

Hereinafter, a preferred embodiment of the present invention is described in detail with reference to the accompanying drawings.

Figure 1:
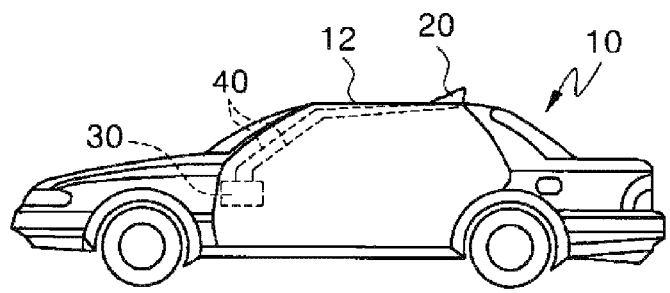
FIG. 1 is a diagram schematically illustrating the location where an antenna module and a tuner unit module are installed in a conventional multimedia device for a vehicle.
Figure 2:
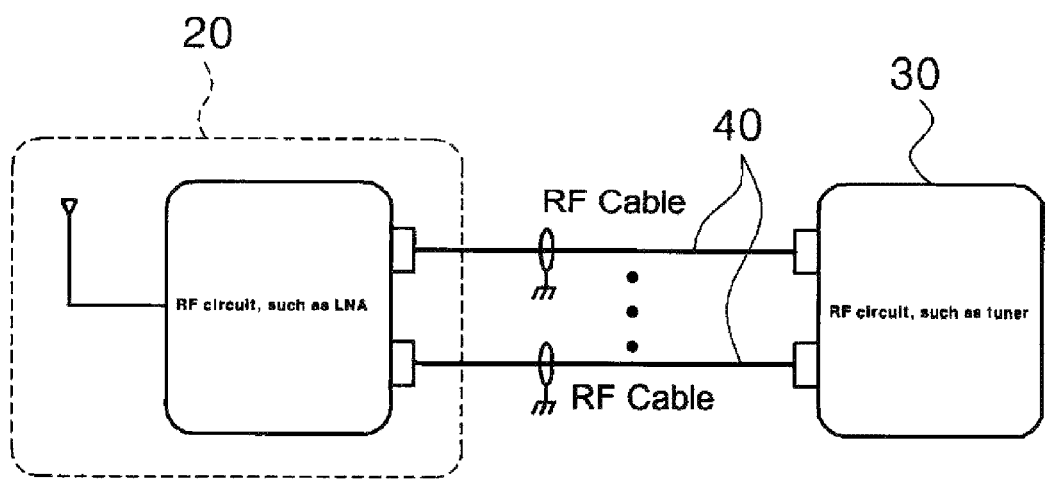
FIG. 2 is a diagram schematically illustrating a conventional configuration in which the antenna module and the tuner unit module are coupled through coaxial cables.
Figure 3:
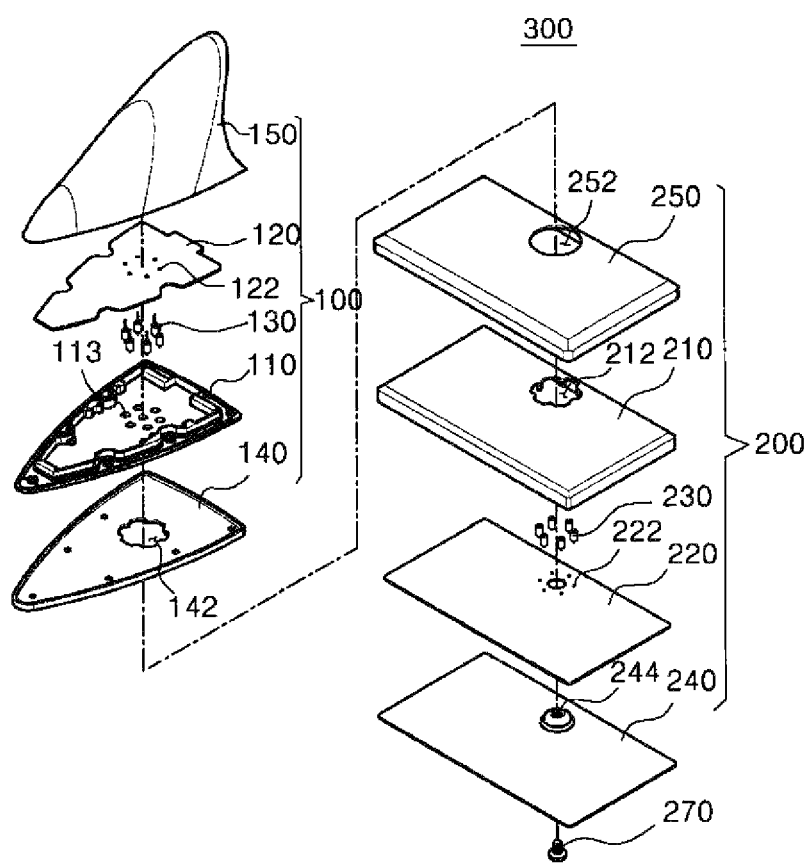
FIG. 3 is an exploded perspective view illustrating the configuration of a multimedia device for a vehicle in accordance with an embodiment of the present invention.
Figure 4:
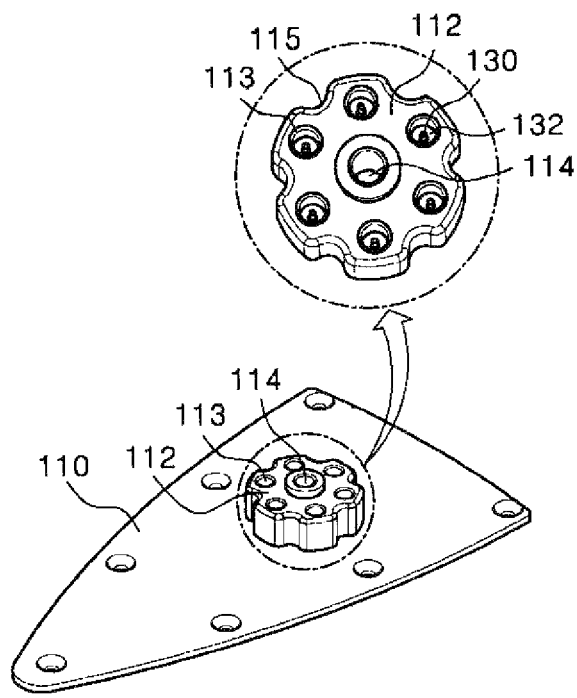
FIG. 4 is a detailed diagram illustrating the structure of the bottom of an antenna body in the antenna module illustrated in FIG. 3.
Figure 5:
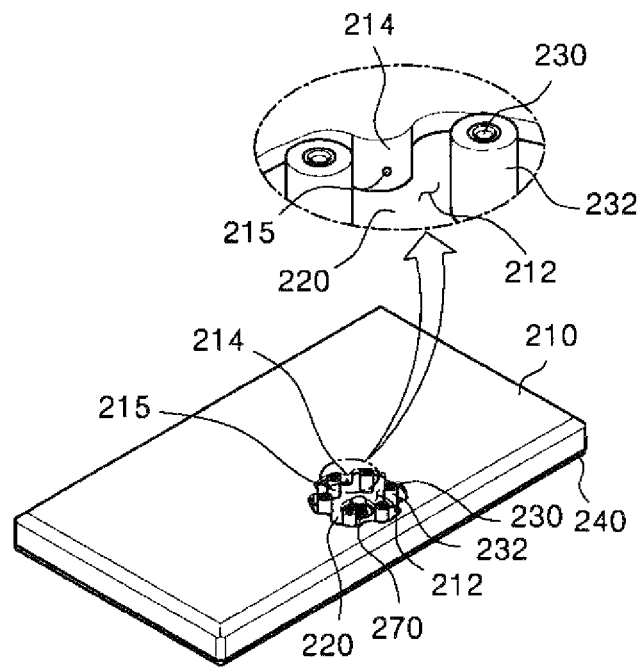
FIG. 5 is a detailed diagram illustrating a detailed structure of a coupling groove portion formed in a tuner unit body in a tuner unit module illustrated in FIG. 3.
Figure 6:
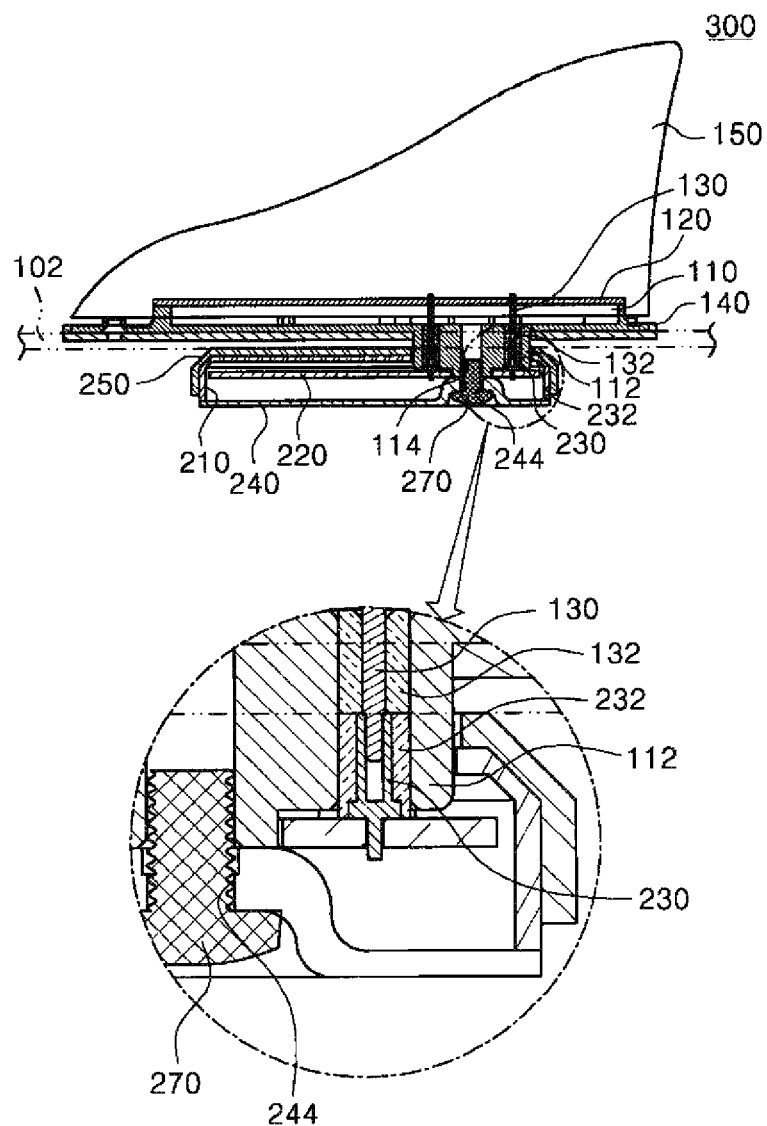
FIG. 6 is a coupling cross-sectional view illustrating a structure in which the multimedia device for a vehicle is installed in the roof of a vehicle according to the present invention.

FIG. 3 is an exploded perspective view illustrating the configuration of a multimedia device for a vehicle in accordance with an embodiment of the present invention. Furthermore, FIG. 4 is a detailed diagram illustrating the structure of the bottom of an antenna body in the antenna module illustrated in FIG. 3, and FIG. 5 is a detailed diagram illustrating a detailed structure of a coupling groove portion formed in a tuner unit body in a tuner unit module illustrated in FIG. 3. Furthermore, FIG. 6 is a coupling cross-sectional view illustrating a structure in which the multimedia device for a vehicle is installed in the roof of a vehicle according to the present invention Referring to FIGS. 3 to 6, the multimedia device 300 for a vehicle according to the present invention is configured to include an antenna module 100 that is installed on the external surface of the roof panel 102 of the vehicle and that sends and receives externals radio signals, a tuner unit module 200 that is coupled to the antenna module 100 under the roof panel 102 of the vehicle and that processes signals transferred by the antenna module 100, and a screw 270 that is a coupling member for coupling the tuner unit module 200 to the antenna module 100. As described above, the multimedia device 300 according to the present invention has a structure in which the antenna module 100 and the tuner unit module 200 are coupled and assembled with the roof panel 102 of the vehicle interposed therebetween and integrated into a single module.

Specifically, the antenna module 100 includes an antenna body 110, a first circuit board 120 installed over the antenna body 110, a lower cover 140 coupled with the bottom of the antenna body 110, and an upper cover 150 coupled with the lower cover 140 over the first circuit board 120.

The antenna body 110 is formed of a conductor having a streamlined triangular shape. A connector unit 112 downward protruded at a specific width so that it is able to be coupled with the tuner unit module 200 placed on the lower side through the roof panel 102 of the vehicle is formed in the bottom of the antenna body 110.

Furthermore, a plurality of through holes 113 upward penetrated so that a plurality of communication lines (first and second connection pins to be described later) for transferring signals between the antenna module 100 and the tuner unit module 200 passes through the through holes 113 is formed on the inside of the connector unit 112.

Furthermore, a coupling hole 114 to which the screw 270 is coupled is formed on the inside of the connector unit 112 in order to couple the antenna module 100 and the tuner unit module 200. In this case, the coupling hole 114 is disposed at the central part of the connector unit 112. The through holes 113 are configured to form a circle around the coupling hole 114 and arranged at specific intervals.

Furthermore, first connection pins 130, that is, communication lines for transferring signals, are respectively surrounded by first dielectric bodies 132 made of a teflon material and are received in the respective through holes 113 formed in the connector unit 112.

In this case, the top ends of the first connection pins 130 are inserted into a plurality of connection holes 122 formed in the first circuit board 120 and are electrically connected to the first circuit board 120. The bottom of each of the first connection pins 130 is downward exposed at a specific width from the bottom of each of the first dielectric bodies 132. In this case, the up and down width of the first dielectric body 132 is preferably formed to have a length that is half of the upper and down width of the through hole 113.

The lower cover 140 is coupled to the bottom of the antenna body 110, brought in contact with the external surface of the roof panel 102 of the vehicle, and seated therein. The lower cover 140 is made of an insulating material, such as rubber or synthetic resin. A hole 142 having a shape corresponding to the outward appearance of the connector unit 112 is formed on the inside of the lower cover 140 on one side thereof so that the connector unit 112 of the antenna body 110 penetrates. Such a lower cover 140 functions to maintain insulation between the roof panel 102 and the antenna body 110 and also to block vibration transferred from the roof panel 102 to the antenna module 100.

The upper cover 150 is a casing having a shark's fin shape and is coupled to the lower cover 140 placed under the upper cover 150 over the first circuit board 120 so that it can cover the antenna body 110 and the first circuit board 120.

Meanwhile, the tuner unit module 200 includes a tuner unit body 210 that has an oblong shape, a second circuit board 220 that is installed within the tuner unit body 210, a lower plate 240 coupled to the bottom of the tuner unit body 210, and an insulation cover 250 that surrounds and connects to the top of the tuner unit body 210.

The tuner unit body 210 is an oblong structure formed of a conductor and configured to have a top closed and a bottom open. Furthermore, a coupling groove 212 having a shape corresponding to the outward appearance of the connector unit 112 into which the connector unit 112 of the antenna body 110 is inserted and coupled is formed in the top surface of the tuner unit body 210.

Furthermore, second connection pins 230 are provided in the inside of the coupling groove 212 and engaged with the plurality of first connection pins 130 provided in the antenna module 100, thus forming a plurality of communication lines. In this case, the bottoms of the second connection pins 230 are respectively inserted into a plurality of connection holes 222 formed in the second circuit board 220 within the tuner unit body 210 and are electrically connected to the second circuit board 220. The tops of the second connection pins 230 are respectively engaged with and connected to the first connection pins 130 received in the through holes 113 of the connector unit 112.

In this case, like the first connection pin 130, each of the second connection pins 230 is configured to be surrounded by a second dielectric body 232 made of a teflon 10 material. When the two modules are assembled, the second connection pins 230 are received in the through holes 113 and are inserted into and engaged with the first connection pins 130 in a male and female form.

Furthermore, the insulation cover 250 made of an insulating material, such as rubber or synthetic resin, is coupled to the top surface of the tuner unit body 210. In this case, a circular hole 252 is formed on the inside of the insulation cover 250 so that the connector unit 112 of the antenna body 110 downward penetrates the circular hole 252.

Furthermore, the lower plate 240 is coupled to the open bottom of the tuner unit body 210. In this case, a fastening hole 244 having an upward depressed shape so that the screw 270 is coupled to the fastening hole 244 is formed in the lower plate 240.

Furthermore, a plurality of guide grooves 115 each configured to have an arc shape and inward depressed is formed in the outer circumferential surface of the connector unit 112 provided in the antenna body 110. Furthermore, guide protrusions 214 with which the guide grooves 115 are able to be engaged and coupled are formed in the inner circumferential surface of the coupling groove 212 of the tuner unit module 200 to which the connector unit 112 is coupled. When the antenna module 100 and the tuner unit 10 module 200 are assembled, the guide grooves 115 and the guide protrusions 214 are engaged and coupled together in a convex and concave form. Accordingly, the two modules can be always assembled at accurate locations, and there is no fluctuation between the two modules after the assembly.

Furthermore, stopper protrusions 215 each protruded in a semi-spherical shape are formed in the guide protrusions 214. When the antenna module 100 and the tuner unit module 200 are assembled, the stopper protrusions 215 are pressed against the insides of the guide grooves 115, thus being capable of maintaining temporary coupling force. Accordingly, the fastening task of the screw 270 is facilitated.

The multimedia device 300 for a vehicle configured as described above according to the present invention is assembled in such a manner that the connector unit 112 formed in the antenna body 110 is inserted into the coupling groove 212 formed in the tuner unit body 210 when the antenna module 100 and the tuner unit module 200 are assembled. In this process, the through holes 113 of the connector unit 112 in which the first connection pins 130 and the first dielectric bodies 132 are received are configured to cover second dielectric bodies (teflon) 232 in which second connection pins 230 are respectively embedded and are coupled with the second dielectric bodies 232. Accordingly, as illustrated in FIG. 6, the bottom surfaces of the first dielectric bodies 132 are respectively brought in contact with and closely attached to the top surfaces of the second dielectric bodies 232 within the respective through holes 113 of the connector unit 112. Furthermore, the tops of the first connection pins 130 and the bottoms of the second connection pins 230 are engaged in a male and female form, thus maintaining an electrical connection state. Accordingly, the plurality of communication lines for transferring signals is constructed.

After the connector unit 112 of the antenna module 100 is inserted into the coupling groove 212 of the tuner unit module 200 and electrically connected as described above, the screw 270 is fastened and coupled to the coupling hole 114 formed in the connector unit 112 of the antenna module 100 under the tuner unit module 200, thereby completing the final assembly between the antenna module 100 and the tuner unit module 200.

In this case, in the process of inserting the connector unit 112 of the antenna module 100 into the coupling groove 212 of the tuner unit module 200, the semi-spherical stopper protrusions 215 formed on the outsides of the guide protrusions 214 are forcedly brought in contact with and pressed against the insides of the guide grooves 115, thus being capable of maintaining temporary coupling force. Accordingly, the fastening task of the screw 270 can be conveniently performed.

Furthermore, the insulation cover 250 made of an insulating material, such as rubber or synthetic resin, is configured to cover the top surface of the tuner unit module 200 and coupled therewith. Accordingly, external heat transferred to the tuner unit module 200 through the roof panel 102 can be effectively blocked.

Furthermore, in the aforementioned embodiment of the present invention, the antenna module 100 and the tuner unit module 200 have been illustrated as being closely installed inside and outside the roof panel 102 of the vehicle. However, the antenna module 100 and the tuner unit module 200 may be installed in the same way at various places, such as window glass at the back side of a vehicle, in addition to the roof panel 102 in the aforementioned embodiment.

As described above, in the multimedia device for a vehicle according to the present invention, the tuner unit module 200 conventionally installed on the driver' side of a vehicle is disposed on the lower side of the antenna module 100 mounted outside the vehicle and is coupled to the antenna module 100 through a communication connector axis with the roof panel 102 interposed therebetween. Accordingly, an installation cost according to the construction of a multimedia system can be significantly reduced because a plurality of expensive coaxial cables and connectors for coupling the antenna module and the tuner unit module as in the prior art are not required, and task convenience according to a system construction can be improved because a separate cable task for coupling the modules is not required.

Furthermore, in the present invention, a radio signal is transferred at the distance that is very close to the tuner unit module 200 on the lower side through the connector unit 112 formed in the antenna module 100. Accordingly, a loss of the transfer of a signal can be reduced because accurate impedance is maintained between the two modules. Furthermore, in a process of assembling the two modules, the screw 270 is fastened to the connector unit 112 of the antenna module 100 under the tuner unit module 200. Accordingly, an assembly process is simple and workability can be improved because the antenna module 100 and the tuner unit module 200 can be simply assembled.

The aforementioned embodiments of the present invention have been disclosed for illustrative purposes. Those skilled in the art to which the present invention pertains may perform various modifications, changes, and additions within the spirit and scope of the present invention, and such modifications, changes, and additions should be construed as belonging to the scope of the present invention.

The invention claimed is:

1. A multimedia device for a vehicle, comprising:
   an antenna module, comprising an antenna body disposed on an external side of a roof of the vehicle, a first circuit board coupled to the antenna body, a connector unit downward protruded from a bottom of the antenna body so that the connector unit penetrates a surface of a vehicle body and equipped with a plurality of through holes penetrated up and down, and a plurality of first connection pins received in the respective through holes of the connector unit and electrically connected to the first circuit board;
   a tuner unit module, comprising a tuner unit body disposed inside the roof of the vehicle, a second circuit board coupled to the tuner unit body, and a coupling groove into which the connector unit is inserted and coupled, wherein a plurality of second connection pins electrically connected to the second circuit board and engaged with the first connection pins within the through holes is provided within the coupling groove;
   a coupling member coupling the antenna module and the tuner unit module; and
   first dielectric bodies and second dielectric bodies inserted into the through holes of the connector unit and respectively surrounding the first connection pins and the second connection pins.

2. The multimedia device of claim 1, wherein:
   a coupling hole to which the coupling member is coupled is formed at a central part of the connector unit, and
   the coupling member penetrates the tuner unit module from bottom to top under the tuner unit module and is fastened to the coupling hole of the connector unit.

3. The multimedia device of claim 2, wherein the plurality of through holes is arranged to form a circular form around the coupling hole.

4. The multimedia device of claim 1, wherein:
   guide grooves are formed in an outer circumferential surface of the connector unit, and guide protrusions engaged and coupled with the guide grooves are formed in an inner circumferential surface of the coupling groove.

5. The multimedia device of claim 4, wherein stopper protrusions closely attached to insides of the guide grooves are formed in the guide protrusions.

6. The multimedia device of claim 1, wherein an insulation cover for insulation with the roof is further installed in the tuner unit module.

* * * * *